United States Patent
Misium et al.

(10) Patent No.: US 6,268,296 B1
(45) Date of Patent: Jul. 31, 2001

(54) LOW TEMPERATURE PROCESS FOR MULTIPLE VOLTAGE DEVICES

(75) Inventors: George R. Misium, Plano; Sunil V. Hattangady, McKinney, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/216,562

(22) Filed: Dec. 18, 1998

Related U.S. Application Data

(60) Provisional application No. 60/070,149, filed on Dec. 31, 1997.

(51) Int. Cl.⁷ .......................... H01L 21/31; H01L 21/469
(52) U.S. Cl. .......................... 438/763; 438/763; 438/766; 438/770
(58) Field of Search ...................................... 438/770, 766, 438/233, 919, 763

(56) References Cited

U.S. PATENT DOCUMENTS

| | | | |
|---|---|---|---|
| 4,417,385 * | 11/1983 | Temple | 29/571 |
| 4,420,871 * | 12/1983 | Scheibe | 29/571 |
| 4,517,729 * | 5/1985 | Batra | 29/571 |
| 4,642,881 * | 2/1987 | Matsukawa et al. | 29/576 B |
| 5,329,138 * | 7/1994 | Mitani et al. | 257/42 |
| 5,429,972 * | 7/1995 | Anjum et al. | 437/47 |
| 5,672,521 * | 9/1997 | Barsan et al. | 437/24 |
| 5,780,330 * | 7/1998 | Choi | 438/232 |
| 5,918,133 * | 6/1999 | Gardner et al. | 438/299 |
| 5,920,779 * | 7/1999 | Sun et al. | 438/275 |
| 5,930,617 * | 7/1999 | Wu | 438/233 |
| 5,960,289 * | 9/1999 | Tsui et al. | 438/275 |

* cited by examiner

*Primary Examiner*—John F. Niebling
*Assistant Examiner*—Walter L. Lindsay, Jr.
(74) *Attorney, Agent, or Firm*—Wade James Brady, III; Frederick J. Telecky, Jr.

(57) ABSTRACT

A method is disclosed for making gate oxides on a silicon wafer surface for multiple voltage applications comprising the steps of growing an oxide layer (12) on a wafer (10) surface. Next, a photoresist layer (14) is deposited over a portion of the oxide layer (12) and the isolation (30). The entire wafer (10) is exposed to a nitrogen ion containing plasma to form a nitrided layer (22). The photoresist (14) is removed, and the exposed portion of the oxide layer (12) is etched to the wafer (10) surface. Finally, an oxidation step forms a silicon dioxide layer (34) having a different thickness than the silicon dioxide layer (12).

27 Claims, 2 Drawing Sheets

LOW TEMPERATURE PROCESS FOR MULTIPLE VOLTAGE DEVICES

This application claims priority under 35 USC § 119 (e)(1) of provisional application No. 60/070,149 filed Dec. 31, 1997.

TECHNICAL FIELD OF THE INVENTION

The present invention relates in general to the field of integrated circuit manufacturing, and more particulary, to the formation of a thin film of nitride by using a nitrogen plasma to allow selectively etching of layers during the formation of integrated circuit components requiring multiple voltages.

BACKGROUND OF THE INVENTION

Without limiting the scope of the invention, its background is described in connection with the manufacture and formation of integrated circuit components for use in the creation of metal oxide semiconductors, as an example.

Heretofore, in this field, the major steps in silicon wafer fabrication have been the use of diffusion, metallization, etching and chemical clean-up steps to form semiconductors. The introduction of thermal oxidation of silicon, the use of lithographic photoresist techniques and etching of the various components using specific and non-specific chemical agents brought forth the era of the planar processing of semiconductor integrated circuits.

More recently, complementary metal oxide silicon devices (CMOS) have been formed by the growth, deposition and etching of conductive and non-conductive layers taking advantage of chemical-vapor deposition (CVD) and ion implantation techniques. Chemical vapor deposition allowed for the selective and non-selective deposition of, e.g., etch protective overcoats, and of masking material.

In addition to CVD, other common ways for the deposition of conducting or insulation thin films has been the use of vacuum deposition or sputtering. Vacuum deposition and sputtering coat the wafer with a thin film which can, e.g., form an inorganic insulating material when heated in a reactive atmosphere. All three techniques can be used to achieve the deposition of a conducting or insulating layer. The deposited layers may also be used as sacrificial layers for use in the selective etching and formation of an integrated circuit component.

SUMMARY OF THE INVENTION

It has been found, however, that present methods for integrated circuit design and manufacture using silicon nitride layers account for a significant portion of the thermal budget during wafer processing. The thermal budget must be lowered to, e.g., enable scaling of high density integrated circuits. The use of large amounts of chemical etching agents to remove these sacrificial layers can contribute to device failure (due, e.g., to mobile ions in the etching agents). In addition, the large number of high temperature processing steps can cause a significant impact on energy consumption and environmental impact of the current methods.

Furthermore, the deposition of thick silicon nitride layers can be required when deep etching of surrounding area is to be accomplished. Due to the thermal expansion of the layer during high temperature steps, mechanical stress resulting from the thick silicon nitride layer can lead to device failure.

What is needed is an improved method for the formation of a nitride layer, but that, does not require a high temperature deposition step. Also, a need has arisen for a nitride layer that can be selectively deposited without affecting a photoresist layer. Also needed, is a thinner layer (to lessen the mechanical stress otherwise caused within a thick layer at high temperatures) The layer, however, preferably still should be an effective barrier against mobile ions, and be easily removed in subsequent steps when used as a sacrificial layer.

The present invention provides an improved method for creating a nitrided silicon layer, or nitrided layer, which is resistant to oxide etching agents but does not require a high temperature deposition step. Using the present invention a nitrided layer can be selectively deposited without affecting a photoresist layer. The method of the present invention can also allow for the deposition of a thin layer that lessens the mechanical stress caused within the layer at high temperatures. The nitrided layer of the present invention can provide an effective barrier against mobile ions, and can be easily removed during subsequent steps when used as, e.g., a sacrificial layer.

More particulary, the present invention is directed to a method of making gate oxides on a silicon wafer surface, for multiple voltage applications, comprising the steps of growing a first oxide layer on at least first and second areas of the surface and patterning a layer of photoresist over the first area of the oxide layer. The photoresist and the second oxide area not covered by the photoresist are exposed to a nitrogen ion containing plasma, where the nitrogen ions convert a top layer of the exposed oxide area and the photoresist into a nitrided layer. The photoresist is then stripped and the second area of the oxide layer not protected by the photoresist is partially etched, or etched to the wafer surface. Finally, the entire wafer surface is exposed to an oxidating environment in order to grow a second oxide layer. The oxidating environment grows oxide layers having different thicknesses. In one embodiment, the exposed portion of the oxide layer is etched down to about 40 angstroms before the photoresist is stripped and protects the bare silicon surface of the wafer from exposure to contaminants from the photoresist.

In one embodiment, a low temperature method for making gate oxides on a silicon wafer surface, for dual voltage applications, includes obtaining a substrate and growing an oxide layer on the substrate. The oxide layer has a surface that is exposed to a nitrogen ion containing plasma, where the nitrogen ions form a nitrided layer on the oxide containing surface that can be used to protect layers underneath the nitridated layer from, for example, selective etching agents.

More particularly, the oxide containing surface can be further defined as a silicon oxide layer, the oxide containing surface being at a temperature below 600 degrees Celsius, and in one embodiment the temperature being room temperature. The nitrogen ion plasma can be created by a remote plasma.

The step of exposing the oxide containing surface to a nitrogen ion containing plasma can be further defined as occurring at between about 4 and 12 mTorr, and in one embodiment may be, for example, at about 4 mTorr. The step of exposing the oxide containing surface to a nitrogen ion containing plasma can also be defined as occurring for between about 10 to 90 seconds, in one embodiment the exposure occurring for about 60 seconds. In yet another embodiment, the oxide containing surface can be exposed to a nitrogen ion containing plasma at between about 1000 and 3000 watts. In one embodiment the nitrogen ion containing plasma can be created at about 2000 watts. In yet another embodiment the oxide surface is nitridated for 30 seconds in a 2000 W plasma. During the etching step, in one embodiment, the oxide is etched in a buffered hydrofluoric acid for 100 seconds. Additionally, a silicon layer, such as a polysilicon or amorphous silicon layer can be deposited on the oxide layer after the second oxide growth step. In yet another embodiment, the rate of formation of the nitrided oxide layer is dependent on a substrate bias, where the rate of nitrogen ion implantation into the silicon substrate depends on the voltage difference between the substrate and the plasma.

In yet another embodiment, a low temperature method for making gate oxides on a silicon wafer surface for dual voltage applications comprises the steps of growing a first oxide layer on at least first and second areas of the surface of the silicon wafer followed by the patterning of a layer of photoresist over a first area of the oxide layer. The next step involves exposing the photoresist and a second oxide area not covered by the photoresist to a nitrogen ion containing plasma, wherein the nitrogen ions convert a top layer of the exposed oxide area and the photoresist into a nitrided layer. To prevent contamination of subsequent processing layers and steps the photoresist is stripped, and the wafer cleaned. Next, the second area of the oxide layer not protected by the photoresist is etched to the wafer surface. The nitrided layer over the first area of the oxide layer is also etched and the wafer surface is exposed to an oxidating environment in order to grow the first area and second areas of the silicon wafer surface.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which.

DETAILED DESCRIPTION OF THE INVENTION

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention and do not delimit the scope of the invention.

The present invention is directed to a process for rendering a silicon dioxide layer resistant to etch chemistries used in integrated circuit component manufacturing, such as, hydrofluoric acid (HF). Remote plasma nitridation is used to selectively nitridate or nitridize a small layer of a silicon dioxide layer. The remote plasma nitridation may form, in situ, a "silicon nitride" which is to be understood as including a heterogenous mixture of silicon nitride ($Si_3N_4$) and silicon oxynitride ($SiNO_x$).

To prevent the nitridation by remote plasma deposition over specific locations on a silicon dioxide layer, a layer of lithographically developed photoresist can be placed over the silicon dioxide prior to nitridation to cover portions of the silicon dioxide. The photoresist prevents the interaction between the nitrogen ions created in the remote plasma and the silicon dioxide covered by the photoresist.

An alternative option is use remote plasma nitridation to cover the surface of the silicon dioxide layer with a nitrided layer prior to the application of a lithographic photoresist layer. The photoresist then serves as a masking layer to protect portions of the nitridized areas during a nitride removal etch.

Figure 1A:
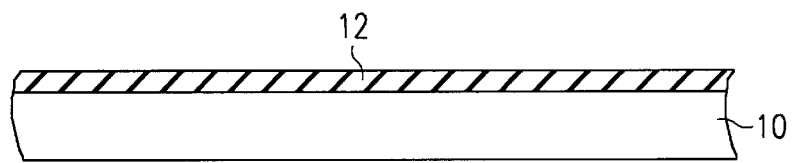
FIGS. 1a–c are illustrative cross-sections of one embodiment of the method of the present invention.
Figure 1B:
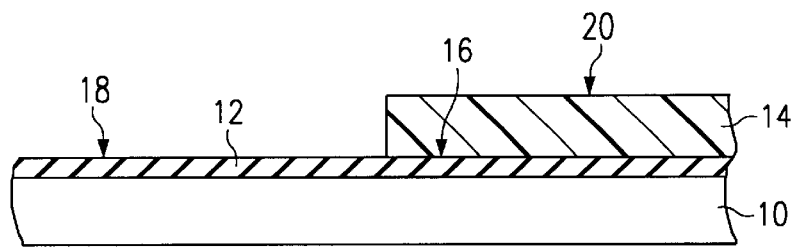
Figure 1C:
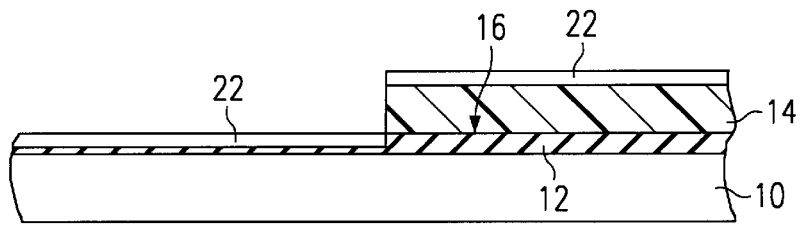

The general features of the method for rendering silicon dioxide resistant to HF chemistries by the remote plasma nitridation of the present invention are shown in FIGS. 1a–c. A portion of a wafer 10 on which a silicon dioxide layer 12 has been formed is illustrated FIG. 1a. The wafer 10 is typically on a single crystal silicon substrate and can include circuit devices as well as wiring and insulating layers.

An method for rendering silicon dioxide resistant to HF chemistries by the remote plasma nitridation is shown in FIGS. 1a–c. The general features of the method for rendering silicon dioxide resistant to HF chemistries by the remote plasma nitridation of the present invention are shown in FIGS. 1a–c. A portion of a wafer 10 on which a silicon dioxide layer 12 has been formed is illustrated FIG. 1a. The wafer 10 is typically a single crystal silicon substrate. The silicon dioxide layer 12 is grown over the wafer 10 by a high temperature processing step in an oxidating environment.

Next, as shown in FIG. 1b, a photoresist layer 14 is shown patterned on a portion of the surface 16 that will not be exposed to the remote plasma nitrogen ions. The surface 18 of the silicon dioxide layer 12 and the top surface 20 of the to photoresist layer 14 are then exposed, as shown in FIG. 1c, to a nitridating atmosphere created in a remote plasma nitridation chamber (not shown), causing the surface of the silicon dioxide layer 12 to be nitridated. In subsequent processing steps, the photoresist layer 14 can be removed and further processing of the oxide surface 16 or the nitrided layer surface 22 can follow.

To etch the silicon dioxide layers, HF in various dilutions in water and often buffered with ammonium fluoride can be used. Silicon is etched in HF at a minuscule rate and thus provides an etch stop after an overlying oxide layer is etched. When using HF etchants the etching rate increases and decreases with etchant concentration. Increasing the temperature also increases the etch rate, with buffered solutions containing the etchants having a slightly higher activation energy.

Figure 2A:
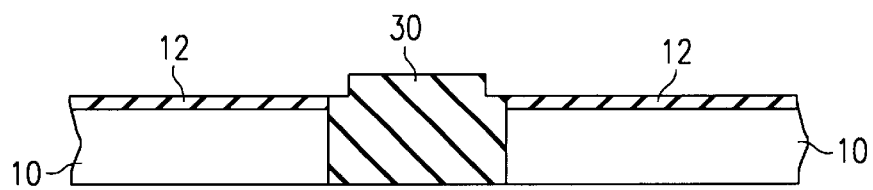
FIGS. 2a–f are illustrative cross-sections of another embodiment of the method of the present invention.
Figure 2B:
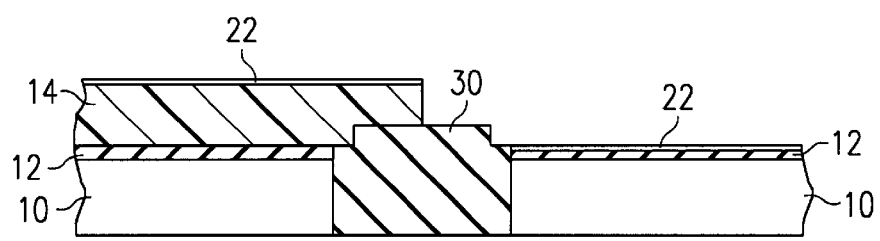
Figure 2C:
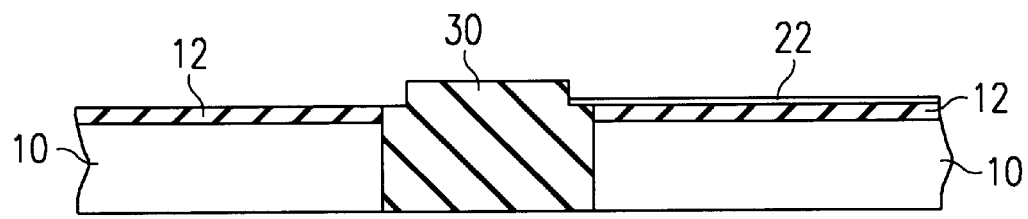

FIGS. 2a–f are illustrative cross-sections of one embodiment of a gate oxide structure and method made using the remote plasma nitridation process described in FIG. 1. An isolation 30 is made on a portion of a wafer 10 on which a silicon dioxide layer 12 has been grown. A photoresist is patterned over one area of the silicon dioxide layer 12 and the isolation 30. A nitrided layer 22 is created on the entire surface of the silicon dioxide layer 12 and the photoresist 14 as shown in FIG. 2b. The nitrided layer 22 can be created by, for example, a 30 second exposure to a remote plasma containing nitrogen ion created using 2000 watts of power. Next, the photoresist layer 14 is removed leaving an exposed area of silicon dioxide 12 and a nitrided layer 22 as shown in FIG. 2c. The wafer 10 can now be prepared to remove any mobile ions that could have become associated with the bare silicon on wafer 10. A short anneal step can be used at this or later steps. One such anneal step can be a rapid thermal anneal carried out at 950 degrees Celsius for 30 seconds.

Figure 2D:
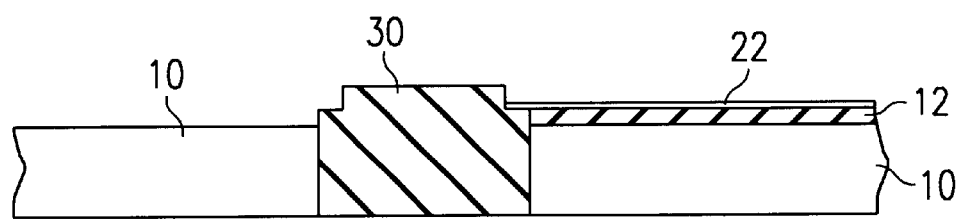

As shown in FIG. 2d, the silicon dioxide layer 12 has been completely etched away from the non-nitrided areas using, for example, buffered HF. In an alternative embodiment, silicon dioxide layer 12a can also be selectively etched to a small thickness, such as a 40 angstrom thickness over the wafer 10.

Figure 2E:
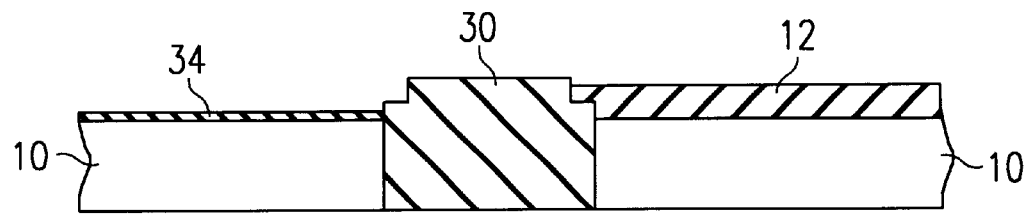
Figure 2F:
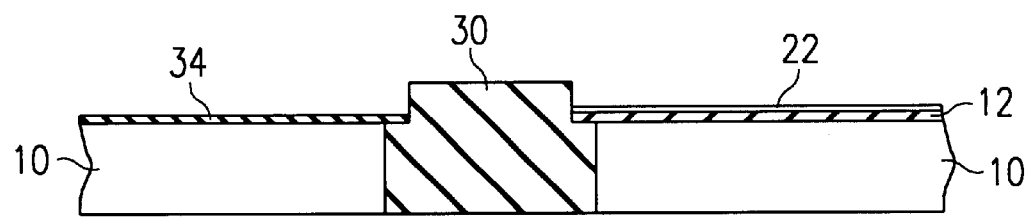

Alternatively, the silicon dioxide layer 12a can be etched down to the wafer 10, leaving exposed bare silicon on the wafer 10 surface that can be oxidized to form a thin silicon dioxide layer 34, that is thinner than the silicon dioxide layer 12, yielding the cross-section depicted in FIG. 2e. In FIG. 2f, the thinner silicon dioxide layer 34 is grown on the exposed surface of the silicon wafer 10, while the nitrided layer 22 has remained on the silicon dioxide layer 12. The nitride layer 22 protects the silicon dioxide layer 12 from further oxidation, however, the exposed bare silicon on the surface of wafer 10 is grown only to a thinner silicon dioxide layer 34, again yielding the desired dual layers.

Etching conditions for use with the invention can vary, but in one example can be a 100 second exposure to buffered hydrofluoric acid. A partial etching step may also be added for 155 seconds in BHF.

Unlike dual gate-oxide processes of the prior art, the process of the present invention prevents the exposure of the wafer 10 to contaminants from the photoresist layer 14 and the etch chemicals that can deposit reactive radicals. These reactive radicals, also known as mobile ions, decrease the reliability of the device by contaminating subsequent layers or structures. The photoresist layer 14 can be removed with a standard piranha or nanostrip, followed by gate clean-up step of HF and SC1.

Alternatively, additional layers can be deposited and protected by the remote plasma nitridation and photoresist process to have more than two layers having different thicknesses, as is found in electrically erasable programmable read-only memory (EEPROM) cells and non-volatile memory applications. Additional layers, such as polysilicon and amorphous silicon layers (not depicted) can be deposited and protected using the remote plasma nitridation process disclosed herein. Furthermore, the nitridation step may introduce nitrogen in the oxide-silicon interface, thereby improving device reliability.

Silicon nitride can be wet etched, for example, with either HF solutions or with hot phosphoric acid. Phosphoric acid is the "standard" wet nitride etch. In it, the nitride can etch more than 40 times as fast as CVD oxide, which is often used as a mask. The selectivity decreases at high temperatures, but in order to have useful etch rates, high-temperature boiling concentrated $H_3PO_4$ generally are used. For example, 91.5% $H_3PO_4$ boils at 180 degrees Celsius, etches high-temperature nitride at approximately 100 Angstroms/minute, and etches CVD oxide at about 10 Angstroms/minute. Under these same conditions, single-crystal silicon etches about 30% as fast as CVD oxide.

The remote plasma nitridation used in the invention can be carried out as follows. Nitridation can be performed at, for example, room-temperature by exposing a gate oxide to a short, high-density, remote helicon-based nitrogen discharge. Process conditions for the nitridation can be, for example, a process pressure of 2.7 to 12 mTorr, an input plasma power of 500 to 3000 watts, and a durations of 3 to 90 seconds. In one embodiment of the present invention, a high density plasma discharge from a helicon-based nitrogen discharge is created using a plasma power of 1000 to 3000 watts. A power of 2000 watts can also be used. The chamber pressure can also be from 4 to 12 mTorr. Finally, a nitridation exposure time can be from about 10 to 90 seconds. In one embodiment, the nitridation exposure time was 20 seconds.

The wafer can be supported on a ceramic ring (electrically floating) or, alternatively, on an electrostatic chuck (capacitively coupled to ground).

Post-nitridation annealing in an inert or low partial-pressure oxygen ambient can be performed using a furnace or rapid-thermal annealing. In one embodiment, the post-nitridation anneal is conducted in a controlled environment having, e.g., $N_2$, in an ambient or dilute ambient oxidation environment. Next, a rapid thermal anneal at 1000 degrees Centigrade for 60 seconds is conducted.

Depth profiling analysis can be performed on nitrided oxides with or without a 10 nm a-Silicon dioxide cap layer. Dynamic SIMS analysis can be performed using 1 keV Cs primary ion bombardment. Monitoring of CsSi+, CsO+, and CsN+ ions can be conducted to track [SI], [N] concentrations, respectively.

Separately, Time-of-flight SIMS (TOFSIMS), analysis can be performed using a 2 keV Ga+ primary ion bombardment, achieving 0.5–0.7 nm depth resolution within the top 5 nm of the dielectric film. Gallium, for example, can be selected as a primary ion source to minimize the pre-equilibrium effect nominally associated with Cs+ and O+ ion sources, allowing meaningful analysis of N and O concentrations from the top five angstroms. $Si_xN+$ and $Si_xO+$ ions can be used to track [N] and [O] as a function of depth. While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of making gate oxides on a silicon wafer surface, for dual voltage applications, comprising the steps of:
   growing a first oxide layer on at least first and second areas of said surface;
   patterning a layer of photoresist over said first oxide layer on said first area;
   exposing the photoresist and said first oxide layer over said second area not covered by said photoresist to a nitrogen ion containing plasma, wherein said nitrogen ions convert a top layer of said first oxide layer over said second area and said photoresist into a nitrided layer;
   stripping said photoresist;
   etching said first oxide layer over said first area to the wafer surface; and
   exposing said wafer surface to an oxidating environment in order to grow a second oxide layer.

2. The method of claim 1, exposing at least one of said oxide areas to a nitrogen ion containing plasma is further as occurring at a temperature below 600 degrees Celsius.

3. The method of claim 2, wherein said temperature is room temperature.

4. The method of claim 1, wherein said nitrogen ion plasma is created by a remote plasma.

5. The method of claim 1, wherein the etching step is further defined as etching the exposed portion of said second area to a thickness of about 40 angstroms.

6. The method of claim 1, further comprising the step of:
   depositing a polysilicon layer over said first and second oxide areas.

7. The method of claim 1, exposing at least one of said oxide areas to a nitrogen ion containing plasma is further defined as occurring at between about 4 and 12 mTorr.

8. The method of claim 7, exposing at least one of said oxide areas to a nitrogen ion containing plasma is further defined as occurring at about 4 mTorr.

9. The method of claim 1, exposing at least one of said oxide areas to a nitrogen ion containing plasma is further defined as occurring for between about 10 to 90 seconds.

10. The method of claim 1, exposing at least one of said oxide areas to a nitrogen ion containing plasma is further defined as occurring for about 60 seconds.

11. The method of claim 1, wherein said step of exposing said oxide containing surface to a nitrogen ion containing plasma said plasma is further defined as being created at between about 1000 and 3000 watts.

12. The method of claim 1, exposing at least one of said oxide areas to a nitrogen ion containing plasma is further defined as being created at about 2000 watts.

13. The method of claim 1, further including the step of:
  etching the nitrided layer on said first area before the step of exposing said wafer surface to an oxidating environment in order to grow a second oxide layer.

14. A low temperature method for making gate oxides on a silicon wafer surface for dual voltage applications comprising the steps of:
  growing a first oxide layer on at least first and second areas of said surface;
  patterning a layer of photoresist over said first oxide layer on said first area;
  exposing the photoresist and said first oxide layer on said second area to a nitrogen ion containing plasma, wherein said nitrogen ions convert a top layer of said first oxide layer on said second area and said photoresist into a nitrided layer;
  stripping said photoresist;
  etching said first oxide layer on said first area not protected by said nitrided layer to the wafer surface;
  etching the nitrided layer from said second area; and
  exposing the wafer surface to an oxidating environment in order to grow oxide on said first and second areas of said surface.

15. The method of claim 14, exposing at least one of said oxide areas to a nitrogen ion containing plasma is further as occurring at a temperature below 600 degrees Celsius.

16. The method of claim 15, wherein said temperature is room temperature.

17. The method of claim 14, wherein said nitrogen ion plasma is created by a remote plasma.

18. The method of claim 14, wherein the etching step is further defined as etching the exposed portion of said second area to a thickness of about 40 angstroms.

19. The method of claim 14, further comprising the step of:
  depositing a polysilicon layer over said first and second oxide areas.

20. The method of claim 14, exposing at least one of said oxide areas to a nitrogen ion containing plasma is further defined as occurring at between about 4 and 12 mTorr.

21. The method of claim 14, exposing at least one of said oxide areas to a nitrogen ion containing plasma is further defined as occurring at about 4 mTorr.

22. The method of claim 14, exposing at least one of said oxide areas to a nitrogen ion containing plasma is further defined as occurring for between about 10 to 90 seconds.

23. The method of claim 14, exposing at least one of said oxide areas to a nitrogen ion containing plasma is further defined as occurring for about 60 seconds.

24. The method of claim 14, wherein said step of exposing said oxide containing surface to a nitrogen ion containing plasma said plasma is further defined as being created at between about 1000 and 3000 watts.

25. The method of claim 14, exposing at least one of said oxide areas to a nitrogen ion containing plasma is further defined as being created at about 2000 watts.

26. The method of claim 14, wherein said substrate is further defined as having a substrate bias, said substrate bias affecting the rate of formation of said nitrided layer.

27. A method of making gate oxides on a silicon wafer surface, for dual voltage applications, comprising the steps of:
  growing a first oxide layer on at least first and second areas of said surface;
  patterning a layer of photoresist over said first oxide layer on said first area;
  exposing the photoresist and said first oxide layer over said second area to a nitrogen ion containing plasma, wherein said nitrogen ions convert a top layer of said first oxide layer over said second area and said photoresist into a nitrided layer;
  stripping said photoresist;
  partially etching said first oxide layer over said first area, whereby said first oxide layer over said first area has a first thickness, said first oxide layer over said second area has a second thickness, and said first thickness is less than said second thickness.

* * * * *